US010566903B1

(12) United States Patent
Miller et al.

(10) Patent No.: US 10,566,903 B1
(45) Date of Patent: Feb. 18, 2020

(54) SHARING REDUNDANT REGULATOR PHASES WITHIN A PHASE-REDUNDANT VOLTAGE REGULATOR APPARATUS

(71) Applicant: International Business Machines Corporation, Armonk, NY (US)

(72) Inventors: Michael Lee Miller, Rochester, MN (US); Eric B. Swenson, Pine Island, MN (US); Patrick Egan, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/364,782

(22) Filed: Mar. 26, 2019

(51) Int. Cl.
*H02M 3/158* (2006.01)
*H02M 1/32* (2007.01)
(Continued)

(52) U.S. Cl.
CPC .......... *H02M 3/1584* (2013.01); *G08B 21/24* (2013.01); *H02M 1/32* (2013.01); *G05F 1/59* (2013.01);
(Continued)

(58) Field of Classification Search
CPC .. H02M 3/1584; H02M 1/32; H02M 7/53806; H02M 7/5381;
(Continued)

(56) References Cited

U.S. PATENT DOCUMENTS

| 4,039,925 | A | * | 8/1977 | Fletcher | ............ | H02M 7/53806 |
|   |   |   |   |   |   | 363/70 |
| 5,122,726 | A | * | 6/1992 | Elliott | ........................ | G05F 1/59 |
|   |   |   |   |   |   | 323/272 |

(Continued)

FOREIGN PATENT DOCUMENTS

| CA | 2424852 A1 | 10/2003 |
| EP | 3120435 B1 | 5/2018 |
| WO | 94/23489 A1 | 10/1994 |

OTHER PUBLICATIONS

Jung, E., "A FET OR-ing Circuit for Fault-Tolerant Power Systems," Application Report, SLVA116—May 2002, pp. 1-10, Texas Instruments.
(Continued)

*Primary Examiner* — Gary L Laxton
*Assistant Examiner* — Jye-June Lee
(74) *Attorney, Agent, or Firm* — Nathan M. Rau (57) ABSTRACT

A phase-redundant voltage regulator apparatus includes groups of regulator phases, each having a multi-phase controller (MPC) connected to each regulator phase. The MPC transfers, to control logic, phase fault signals and a shared current ($I_{SHARE}$) phase control signal received from the regulator phases of a phase group. Spare regulator phases include output ORing devices to limit current flow into spare regulator phase outputs. Output switching devices are configured to electrically couple spare regulator phase outputs to a common regulator output. Control logic is connected to the phase groups MPC and asserts phase enable signals to, transfers $I_{SHARE}$ phase control signals to, and receives phase fault signals from the spare regulator phases. The control logic electrically interconnects a spare regulator phase to a phase group including a failed regulator phase in response to receiving a phase fault signal from an MPC.

20 Claims, 4 Drawing Sheets

(51) Int. Cl.
*G08B 21/24* (2006.01)
*H02M 1/00* (2006.01)
*H03K 19/20* (2006.01)
*G06F 1/28* (2006.01)
*G05F 1/59* (2006.01)
*G05F 1/618* (2006.01)

(52) U.S. Cl.
CPC ............... *G05F 1/618* (2013.01); *G06F 1/28* (2013.01); *H02M 2001/0009* (2013.01); *H03K 19/20* (2013.01)

(58) Field of Classification Search
CPC .... H02M 2001/0009; H02M 2001/325; G05F 1/59; G05F 1/618; H02J 1/10; H03K 19/20; G08B 21/24; G06F 1/28
See application file for complete search history.

(56) References Cited

U.S. PATENT DOCUMENTS

| | | | |
|---|---|---|---|
| 5,491,786 A | 2/1996 | Egan et al. | |
| 6,275,958 B1* | 8/2001 | Carpenter | H02M 3/158 307/82 |
| 6,301,133 B1* | 10/2001 | Cuadra | H02J 1/102 363/65 |
| 6,433,527 B1 | 8/2002 | Izadinia et al. | |
| 6,515,460 B1 | 2/2003 | Farrenkopf | |
| 6,650,556 B2 | 11/2003 | Dinh et al. | |
| 6,836,100 B2 | 12/2004 | Egan et al. | |
| 7,443,055 B2 | 10/2008 | Pracht et al. | |
| 7,649,404 B2* | 1/2010 | Sikora | H02J 1/10 327/541 |
| 8,233,299 B2 | 7/2012 | Ahmad et al. | |
| 8,441,241 B2 | 5/2013 | Krishnamurthy et al. | |
| 8,610,308 B2 | 12/2013 | Shires et al. | |
| 8,836,306 B2* | 9/2014 | Khanna | H02M 3/1584 323/272 |
| 8,901,909 B2 | 12/2014 | Khanna et al. | |
| 9,030,047 B2* | 5/2015 | Barus | G06F 1/28 307/65 |
| 9,189,040 B2 | 11/2015 | Phadke et al. | |
| 9,213,385 B2 | 12/2015 | Berke et al. | |
| 9,490,663 B1 | 11/2016 | Kim et al. | |
| 9,679,885 B2 | 6/2017 | Lidsky et al. | |
| 9,712,080 B2 | 7/2017 | Phadke | |
| 10,097,092 B1 | 10/2018 | Ho et al. | |
| 2003/0081438 A1* | 5/2003 | Dinh | H02M 3/1584 363/127 |
| 2004/0227495 A1* | 11/2004 | Egan | G05F 1/618 323/272 |
| 2005/0141158 A1 | 6/2005 | Sae-Ueng et al. | |
| 2008/0164759 A1 | 7/2008 | Sharma et al. | |
| 2013/0328400 A1 | 12/2013 | Barus et al. | |
| 2014/0225586 A1 | 8/2014 | Covi et al. | |

OTHER PUBLICATIONS

Konstantinou et al., "Utilising Redundant Voltage Levels for Circulating Current Control in Modular Multilevel Converters," IECON 2015—41st Annual Conference of the IEEE Industrial Electronics Society, 2015, 6 pages. DOI: 10.1109/IECON.2015.7392430.
Egan et al., "Adding a Voltage Level to a Phase-Redundant Regulator Level," U.S. Appl. No. 16/364,729, filed Mar. 26, 2019.
Miller et al., Reallocation of Regulator Phases Within a Phase-Redundant Voltage Regulator Apparatus, U.S. Appl. No. 16/364,967, filed Mar. 26, 2019.
Miller et al., Reallocation of Regulator Phases Within a Phase-Redundant Voltage Regulator Apparatus, U.S. Appl. No. 16/365,002, filed Mar. 26, 2019.
Miller et al., "Sharing Redundant Regulator Phases Within a Phase-Redundant Voltage Regulator Apparatus," U.S. Appl. No. 16/364,748, filed Mar. 26, 2019.
List of IBM Patents or Patent Applications Treated as Related, Signed Mar. 26, 2019, 2 pages.

* cited by examiner

SHARING REDUNDANT REGULATOR PHASES WITHIN A PHASE-REDUNDANT VOLTAGE REGULATOR APPARATUS

BACKGROUND

The present disclosure generally relates to voltage regulator circuits. In particular, this disclosure relates to sharing redundant regulator phases within a phase-redundant voltage regulator circuit.

A voltage regulator is an electronic device or system designed to receive an input voltage and automatically maintain a constant voltage level on one or more output terminals. Depending on the design, a voltage regulator can be used to regulate one or more alternating current (AC) or direct current (DC) voltages. Voltage regulators can be included in electronic devices such as computer power supplies where they can be used to stabilize DC voltages used to supply power to electronic components such as processor(s), memory devices, and other types of integrated circuits (ICs). A voltage regulator circuit can receive a feedback voltage received from a sense point located adjacent to electronic component(s) that the voltage regulator supplies power to. This feedback voltage can be used to modulate an output voltage of the voltage regulator. This modulated output voltage can result in the voltage received by the supplied electronic component(s) being maintained at a stable value regardless of the current draw of the components or voltage drop across conductors interconnecting the voltage regulator to the components.

A field-effect transistor (FET) is a transistor that uses an electric field to control the shape and hence the conductivity of a channel of one type of charge carrier in a semiconductor material. FETs can be unipolar transistors as they can involve single-carrier-type operation. FETs can be majority-charge-carrier devices, in which the current flow is carried predominantly by majority carriers, or minority-charge-carrier devices, in which the current is mainly due to a flow of minority carriers. A FET device can consist of an active channel through which charge carriers, electrons or holes, flow from a source to a drain. Source and drain terminal conductors can be connected to the semiconductor through ohmic contacts. The conductivity of the channel can be a function of the electric potential applied across the gate and source terminals.

SUMMARY

Embodiments can be directed towards a phase-redundant voltage regulator apparatus. The phase-redundant voltage regulator apparatus includes a plurality of regulator phases, each including a regulator electrically coupled to receive, at a regulator input, an input voltage and provide, at a regulator output, a respective output voltage. The phase-redundant voltage regulator apparatus includes a set of phase groups of the plurality of regulator phases including a first and a second phase group. Each phase group includes a common regulator input electrically interconnected to regulator inputs of regulators of the phase group, and a common regulator output electrically interconnected to regulator outputs of regulators of the phase group. Each phase group also includes at least one redundant regulator phase and a multi-phase controller (MPC) electrically coupled to each regulator phase of the phase group. The MPC is configured to transfer, to control logic, phase fault signals and a shared current ($I_{SHARE}$) phase control signal received from each regulator phase of a respective phase group. The phase-redundant voltage regulator apparatus includes a set of spare regulator phases of the plurality of regulator phases including a first and a second spare regulator phase. Each spare regulator phase includes a secondary output ORing device electrically coupled and configured to limit current flow into a secondary output of the spare regulator phase. Each spare regulator phase also includes a first output switching device configured to, in response to a first phase enable signal, electrically couple the regulator output of the spare regulator phase to a first common regulator output. Each spare regulator phase also includes a second output switching device configured to, in response to a second phase enable signal, electrically couple the regulator output of the spare regulator phase to a second common regulator output and a control logic. The control logic is electrically connected to MPCs of each phase group of the set of phase groups, the control logic configured to receive $I_{SHARE}$ phase control signals from, and exchange phase fault signals with the MPCs. The control logic is also electrically connected to spare regulator phases of the set of spare regulator phases. The control logic is configured to assert phase enable signals to, transfer $I_{SHARE}$ phase control signals to, and receive phase fault signals from the spare regulator phases. The control logic is also configured to, in response to receiving a phase fault signal from an MPC, electrically interconnect a spare regulator phase to a phase group that includes a failed regulator phase.

Embodiments can also be directed towards a phase-redundant voltage regulator apparatus. The phase-redundant voltage regulator apparatus can include a plurality of regulator phases, each including a regulator electrically coupled to receive, at a regulator input, an input voltage and provide, at a regulator output, a respective output voltage. The phase-redundant voltage regulator apparatus also includes a set of phase groups of the plurality of regulator phases including a first and a second phase group. Each phase group includes a common regulator input electrically interconnected to regulator inputs of regulators of the phase group and a common regulator output electrically interconnected to regulator outputs of regulators of the phase group. Each phase group includes at least one redundant regulator phase and an MPC electrically coupled to each regulator phase of the phase group. The MPC is configured to transfer, to control logic, phase fault signals and an $I_{SHARE}$ phase control signal received from each regulator phase of a respective phase group. The phase-redundant voltage regulator apparatus also includes a set of spare regulator phases of the plurality of regulator phases including a first and a second spare regulator phase. Each spare regulator phase includes a secondary output ORing field-effect transistor (FET) electrically coupled between the regulator output and a secondary output of the spare regulator and a second comparator having inputs electrically connected to a source terminal and to a drain terminal of the secondary output ORing FET. The second comparator further has an output electrically connected to a gate terminal of the secondary output ORing FET. The second comparator is configured to, in conjunction with the secondary output ORing FET, limit current flow into the secondary output of the spare regulator phase. Each spare regulator phase also includes a first output switching FET electrically connected and configured to, in response to a first phase enable signal, electrically couple the regulator output of the spare regulator phase to a first common regulator output. Each spare regulator phase also includes a second output switching FET connected and configured to, in response to a second phase enable signal, electrically couple the regulator output of the spare regulator phase to a second common regulator. The phase-redundant voltage regulator apparatus also includes control logic. The control logic is electrically connected to MPCs of each phase group of the set of phase groups, the control logic configured to receive $I_{SHARE}$ phase control signals from, and exchange phase fault signals with the MPCs. The control logic is also electrically connected to spare regulator phases of the set of spare regulator phases, the control logic configured to assert phase enable signals to, transfer $I_{SHARE}$ phase control signals to, and receive phase fault signals from the spare regulator phases. The control logic is configured to, in response to receiving a phase fault signal from an MPC, electrically interconnect a spare regulator phase to a phase group that includes a failed regulator phase.

Embodiments can also be directed towards a method for sharing a set of redundant spare regulator phases between phase groups of regulator phases. The method includes using control logic configured to, in response to monitoring phase fault signals received from the phase groups, assert, to a first spare regulator phase of the set of redundant spare regulator phases, in response to detecting a phase single-fault signal from a first phase group, a phase enable signal that electrically couples a primary output of the first spare regulator phase to a common regulator output of the first phase group. The method also includes using control logic to send, to the first spare regulator phase, an $I_{SHARE}$ phase control signal received from an MPC of the first phase group and electrically connect a phase fault signal from the first spare regulator phase to the MPC of the first phase group. The method also includes using control logic to discontinue, in response to detecting the phase single-fault signal from the first phase group, monitoring the phase single-fault signal and store, into a non-volatile memory within the control logic, an association between the first spare regulator phase and the common regulator output of the first phase group. The method also includes using control logic to assert, to a second spare regulator phase of the set of redundant spare regulator phases, in response to detecting an additional phase fault signal from a supplementary phase group, a phase enable signal that electrically couples a primary output of the second spare regulator phase to a common regulator output of the supplementary phase group. The method also includes using control logic to send, to the second spare regulator phase, an $I_{SHARE}$ phase control signal received from an MPC of the supplementary phase group and electrically connect a phase fault signal from the second spare regulator phase to the MPC of the supplementary phase group. The method also includes using control logic to discontinue, in response to detecting the additional phase fault signal from the supplementary phase group, monitoring the additional phase fault signal and store, into the non-volatile memory, an association between the second spare regulator phase and the common regulator output of the supplementary phase group. The method also includes using control logic to send, in response to outputs of all of the redundant spare regulator phases being electrically coupled to common regulator outputs of the phase groups, a system notification requesting a regulator replacement operation.

The above summary is not intended to describe each illustrated embodiment or every implementation of the present disclosure.

BRIEF DESCRIPTION OF THE DRAWINGS

The drawings included in the present application are incorporated into, and form part of the specification. They illustrate embodiments of the present disclosure and, along with the description, serve to explain the principles of the disclosure. The drawings are only illustrative of certain embodiments and do not limit the disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

Certain embodiments of the present disclosure can be appreciated in the context of sharing redundant regulator phases within a phase-redundant voltage regulator circuit. Sharing such redundant regulator phases can be useful in providing, at reduced cost and design complexity, phase redundancy and robust power delivery. The sharing of redundant regulator phases within a voltage regulator circuit can provide increased reliability power delivery to electronic systems.

Embodiments can provide shared redundant regulator phases to electronic equipment such as servers, which can be used to provide data to clients attached to a server through a network. Such servers can include, but are not limited to web servers, application servers, mail servers, and virtual servers. While not necessarily limited thereto, embodiments discussed in this context can facilitate an understanding of various aspects of the disclosure. Certain embodiments can also be directed towards other equipment and associated applications, such as providing shared redundant regulator phases to electronic equipment such as computing systems, which can be used in a wide variety of computational and data processing applications. Such computing systems can include, but are not limited to, supercomputers, high-performance computing (HPC) systems, and other types of special-purpose computers. Embodiments can also be directed towards shared redundant regulator phases for equipment used in such as telecommunications, airborne, and automotive applications.

The acronym "FEY" is used herein in reference to a field-effect transistor which can be useful, within a voltage regulator design, to interconnect two circuit nodes by providing a relatively low impedance electrical connection between the nodes. It can be understood that in embodiments, various types of FETs can be selected by a voltage regulator designer to meet electrical performance criteria of certain voltage regulator designs. Such FET types can include, but are not limited to enhancement-mode, depletion-mode, N-channel field-effect transistor (NFET) and P-channel field-effect transistor (PFET) devices. Such FETs can also be referred to "power FETs," and "power metal-oxide-semiconductor field-effect transistors" (MOSFETs), without loss of meaning. It can also be understood that, in some embodiments, various other types of electronic devices can be used in place of FETs. Such electronic devices can include, but are not limited to, bipolar devices such as NPN and PNP transistors as well as transistors fabricated in other semiconductor technologies.

For ease of discussion and illustration, the terms "ORing device" and "ORing FEY" can be used interchangeably, without loss of meaning, to refer to a semiconductor device configured to prevent the flow of current into a voltage regulator phase output. Although a FET symbol, e.g., 244, FIG. 2, has been used to represent such a device in the Figures, this is not to be construed as limiting; other types of devices, as described above, can also be used for a similar purpose.

The descriptor "ORing," used herein in reference, for example, to "ORing devices," "ORing FETs" and "ORing regulators," can be understood as referring to the logical OR function and output protection function of a device, e.g., FET, or voltage regulator. Such devices and voltage regulators are protected from reverse current flow into a device output by a FET configured to perform in a similar manner as an output protection diode.

The terms "phase" and "regulator phase" are used interchangeably herein in reference to a redundant voltage regulator used within a voltage regulator apparatus. The voltage regulator phase is generally activated by a multi-phase controller (MPC) at a time that is different than activation times of other voltage regulators. This is commonly referred to as being activated "out of phase" with the other voltage regulators.

A wide range of electronic systems employ voltage regulators to provide power delivery, at a stable voltage, to electronic components within the systems. Such electronic systems can include, but are not limited to, computers, computing equipment, servers and equipment used in telecommunications, airborne, and automotive applications. Components within the systems can include, but are not limited to, central processing units (CPUs), graphics processing units (GPUs), other integrated circuit (IC) types, hard disk drives, solid-state drives (SSDs), memory and other types of electronic components and devices.

A voltage regulator can be electrically connected between a power supply and components specified to receive a voltage that is lower than a voltage provided by the power supply. For example, a power supply can provide a variety of voltages, for example 12 V, 24 V or 48 V DC, to a voltage regulator. Output voltages of the voltage regulator can include, for example, 3.3 V, 2.5 V, 1.8 V, 1.0 V, 0.7 V or any other voltage(s) specified as suitable for the powered electronic components and systems.

Voltage regulators including parallel-connected phase-redundant regulators can provide numerous benefits to various electronic systems that they supply power to. For example, such voltage regulators can provide increased system reliability and robustness resulting from the ability of a voltage regulator apparatus to dynamically and automatically replace a failed or faulted regulator phase with a redundant spare or "backup" phase. A regulator phase can fail due to the failure, e.g., short-circuiting, of one or more components such as capacitors, FETs, amplifiers or driver circuits within the regulator phase.

Electronic system reliability can also be increased as a result of reduction of the number of decoupling capacitors within a phase-redundant voltage regulator design. This reduction in capacitor count can result in a lowering of the effective failure rate of the voltage regulator. The addition of one or more redundant or spare phases to a voltage regulator design can also increase the reliability of the design by lowering the overall current demands placed on each of the multiple redundant phases included within the voltage regulator.

The use of phase-redundant voltage regulators having phases activated at staggered times can also result in decreased output voltage ripple and enhanced transient response to variations in current load placed on the phases. Multiple redundant regulator phases can be particularly useful in managing overall voltage regulator system cost. According to embodiments, the cost of a voltage regulator that uses multiple smaller, redundant regulator phases can be significantly less than the cost of a regulator that uses fewer, larger regulator phases each having greater current output.

Certain types of electronic systems can use phase-redundant voltage regulators to supply power to certain subsystems and electronic components. For example, a computer system can have 5 CPUs each having a specified supply voltage requirement of 1.0 V at 80 A, thus creating a total power delivery requirement of 1.0 V at 400 A. This power requirement can, for example, be supplied by 8 phase-redundant voltage regulators, each having a nominal current output capacity of 50 A. Similarly, the electronic system can have another supply voltage requirement of 1.25 V at 200 A, to supply another voltage requirement on the CPUs or another type of device, which can be supplied by 4 phase-redundant voltage regulators, each having a nominal current output capacity of 50 A.

In order to assure reliable operation of the system in the event of failure of one or more of the voltage regulators, additional redundant voltage regulator phases can be added to each individual voltage domain or output level. Following the present example, a designer can incorporate 4 additional redundant voltage regulators into the 1.0 V supply circuit, and 2 additional redundant voltage regulators into the 1.25 V supply circuit, for a total of 6 extra redundant voltage regulators in addition to the above-described 12 voltage regulators.

However, a methodology of adding additional redundant voltage regulators to each voltage level may not be particularly efficient or cost-effective. Excessive and unnecessary cost, consumed power, system space/area, and design complexity can result from the use of this methodology. A more efficient voltage regulator design methodology is desirable; one which reduces the number of components used, cost, consumed power, system area, and design complexity.

According to embodiments, redundant voltage regulators can be added to a voltage regulator design and allocated or shared between various voltage domains on an "as needed" basis. In the present example, one or more redundant voltage regulators can be made available to either the 1.0 V or the 1.25 V supply circuit, and can be dynamically electrically connected to a supply circuit that has experienced the failure of one or more regulators. Control logic can monitor the voltage supply circuits for voltage regulator failures, and can supervise the reallocation of spare voltage regulator phases as needed, in order to provide robust, uninterrupted power delivery on all voltage levels/domains. In the present example, 3 extra redundant voltage regulators can be used to supply the redundancy needs of both the 1.0 V or the 1.25 V supply circuits, thus resulting in a substantial overall reduction of cost, area, number of components and design complexity of a voltage regulator design. The above-provided voltage and current examples are not to be construed as limiting, however, and are provided simply for purposes of illustration and clarification of embodiments of the present disclosure.

The figures herein depict certain example circuits, functions, electrical interconnections and component interactions used to implement embodiments of the present disclosure. These are provided by way of example, and are not to be construed as limiting. Embodiments can also include circuits, functions, electrical interconnections and component interactions not described or depicted herein, within the spirit and scope of the present disclosure.

For ease of illustration and discussion, a limited number of regulator phases, regulator phase groups and spare regulator phases are depicted and discussed herein. For example, two regulator phase groups each including three regulator phases in conjunction with two spare regulator phases can be used to illustrate embodiments of the present disclosure. However, this is not to be construed as limiting; any other number of regulator phases, regulator phase groups and spare regulator phases can be used within embodiments. According to embodiments and design practices, the number "N" of regulator phases used to satisfy the current requirements of a voltage domain within an electronic system can be a relatively small number such as 1 or 2, or it can be much larger, such as 20 or more. Any number of regulator phase groups can be used within an electronic system to satisfy the needs for particular, unique voltage domains. A number of spare regulator phases can be selected by a power system designer based upon an expected average failure rate of a regulator phase, as well as other design criteria.

Embodiments of the present disclosure can be useful in reducing voltage regulator packaging size and cost, relative to voltage regulators not using shared redundant regulator phases to provide regulated voltage levels. An electronic system configured according to embodiments of the present disclosure can have increased reliability and reduced cost, complexity, parts count, and packing area for included voltage regulators.

A phase-redundant voltage regulator apparatus with shared redundant regulator phases, designed according to certain embodiments, can be compatible with existing and proven electronic systems, and can be a useful and cost-effective way to add shared redundant regulator phases to voltage supplies powering an electronic system. A phase-redundant voltage regulator apparatus constructed according to embodiments of the present disclosure can be installed within an existing electronic system.

Embodiments of the present disclosure can be useful for implementing phase-redundant voltage regulators with shared redundant regulator phases for use within electronic systems by using existing and proven IC and printed circuit board (PCB) fabrication technologies and material sets, electronic design methodologies, design tools, and manufacturing processes.

Figure 1:
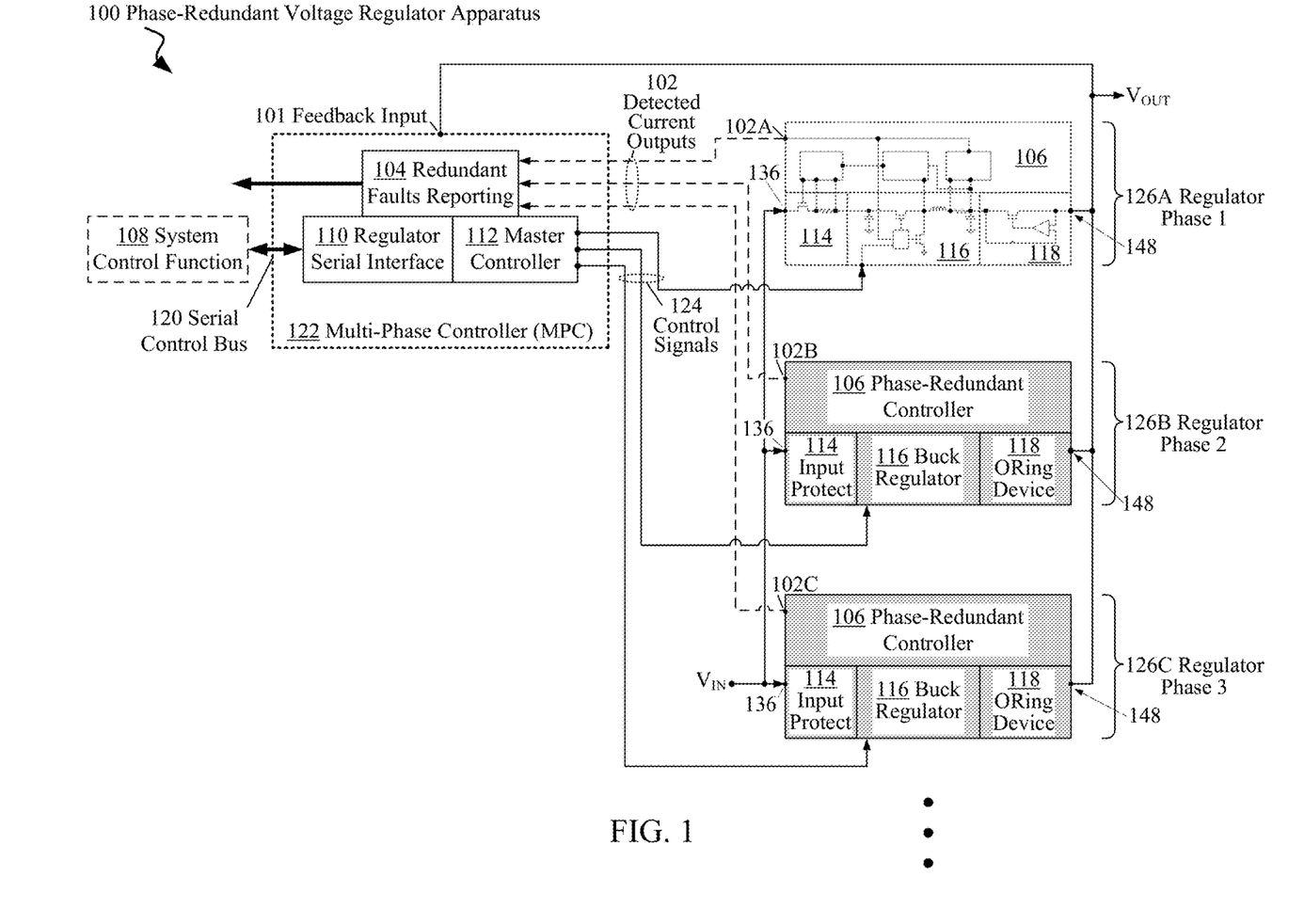
FIG. 1 is a block diagram depicting a phase-redundant voltage regulator apparatus, according to embodiments of the present disclosure.

FIG. 1 is a block diagram depicting a phase-redundant voltage regulator apparatus 100 that includes multiple redundant voltage regulators phases 126A, 126B and 126C. Multiple redundant regulator phases 126A, 126B and 126C are electrically connected in parallel between common regulator input VIN and common regulator output $V_{OUT}$, each of the regulator phases receiving an input voltage at YIN input 136, and providing an output voltage on $V_{OUT}$ output 148.

A quantity of "N+1" or "N+2" voltage regulator phases can be electrically connected in parallel, where "N" represents a minimum number of phases needed to supply a specified current, and the additional one or two phases can be useful in replacing one or two failed voltage regulator phases. In the case of failure or "faulting" of one or more redundant phases, faulty redundant phase(s) can be disabled in order to share a current load between the remaining active phases, and thus to ensure uninterrupted power delivery. A redundant phase can also be used to implement "masked redundancy," meaning that when a phase fails, the fault is not reported to a system control function 108. The redundant phase can then be used to create a high-reliability regulator instead of being used as a redundant phase. This swapping of regulator phases can be controlled by MPC 122.

Each of the regulator phases 126A, 126B and 126C includes a buck regulator 116, an input protection device 114, an ORing device 118 and a phase-redundant controller 106. The phase-redundant controller 106 can be useful, in conjunction with input protection device 114, in isolating the input of a failed buck regulator 116 from the other phases in the apparatus 100. Phase-redundant controller 106 can monitor input and output current and output voltage of a regulator phase, e.g., 126A, and can control input protection device 114 in response to, for example, abnormal currents or voltages within the phase. Such abnormal currents or voltages can result from the failure, e.g., short-circuiting, of components such as capacitors or FETs within buck regulator 116.

The input protection device 114 can be used for providing input overcurrent protection and output overvoltage protection for a respective regulator phase, e.g., regulator phase 1 126A. Input protection device 114 can protect the regulator phase 1 126A by electrically isolating, i.e., disconnecting, the common regulator input YIN from buck regulator 116, in response to a signal generated by phase-redundant controller 106. Each of the regulator phases 126A, 126B and 126C also includes an ORing device 118 that can be used to limit or prevent reverse current flow into the $V_{OUT}$ output 148 of the regulator phase. Such reverse current flow could possibly result from the short circuiting or failure of a FET or a capacitor within a regulator phase.

An MPC 122 is electrically coupled to each of the regulator phases 126A, 126B and 126C, through detected current outputs 102 and control signals 124. Master controller 112 of the MPC 122 generates control signals 124 to periodically and sequentially activate each of the regulator phases 126A, 126B and 126C for predetermined periods of time. In some applications this activation can be used, for example, to generate controlled current sharing between phases. The MPC 122 can be used to maintain current sharing between active regulator phases following a failure or fault of one or more of the regulator phases with one or more phases provided for enabling redundancy. Current sharing can also be implemented between multiple active regulator phases when none of the phases have previously failed.

Redundant faults reporting circuit 104 of the MPC 122 can collect and report phase faults/failures based on the multiple detected current signals presented on detected current outputs 102A, 102B and 102C from the respective regulator phases. The detected current signals can be used and interpreted in order to indicate the failure of one or more particular regulator phase(s). In some applications, the MPC 122 can provide reduced ripple and transient response time from the redundant regulator phases by staggering the respective $V_{OUT}$ outputs 148 to be out-of-phase with each other. The MPC 122 is also configured to adjust the control signals 124 in response to a feedback output voltage, received at feedback input 101, from the common regulator output $V_{OUT}$.

The serial control bus 120 can be used to interconnect the regulator serial interface 110 of the MPC 122 to a system control function 108. The regulator serial interface 110 can send and receive control and monitoring signals to the system control function 108, which can exert control over one or more phase-redundant regulator apparatuses 100, within an electronic system. In applications, system control function 108 can represent a hardware and/or software unit that can be used in an electronic system such as a computer or server, to monitor and control various aspects of the systems hardware functions. A system control function 108 may be used, within an electronic system to monitor and control functions such as power supply and voltage regulator functions, system clock frequency, cooling, and the like.

In some applications, the serial control bus 120 can be, for example, a Serial Peripheral Interface (SPI) bus, a Power Management Bus (PMBus), or an Inter-Integrated Circuit (I²C) interface. The serial control bus 120 can be used to send monitoring data, for example, indicating which regulator phases have failed or faulted, to the system control function 108, and can also receive commands and controls from the system control function 108.

Figure 2:
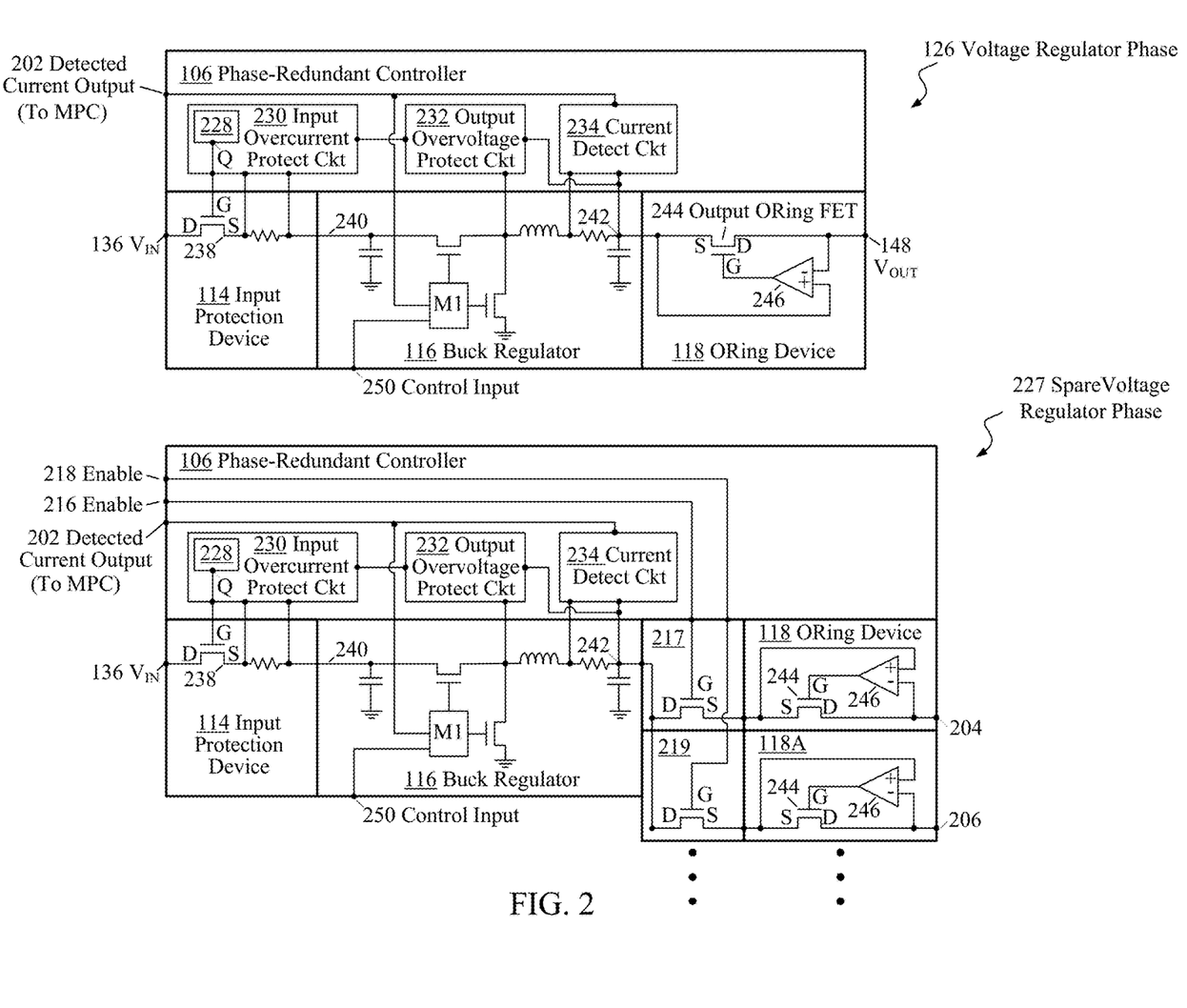
FIG. 2 includes two views depicting a voltage regulator phase and a spare voltage regulator phase, according to embodiments consistent with the figures.

FIG. 2 includes two block diagram views including a view depicting a voltage regulator phase 126 and a view depicting a spare voltage regulator phase 227, according to embodiments consistent with the figures. The various circuits, functions and functional blocks depicted in FIG. 2 are generally consistent with those depicted in and described with reference to FIG. 1. FIG. 2 can be useful in providing an expanded, more detailed depiction of these functions, as well as depicting the addition of switch devices 217 and 219 and ORing devices 118, 118A to a regulator phase, e.g., 126A, FIG. 1 in order to form spare voltage regulator phase 227. It can be understood that view 126 corresponds to a single regulator phase, e.g., regulator phase 1 126A, FIG. 1. The addition of multiple switch devices 217 and 219 and ORing devices 118, 118A can be particularly useful in allowing the regulator output 242 of buck regulator 116 to be selectively electrically connected to more than one output, e.g., primary output 204 and secondary output 206 of the spare voltage regulator phase 227.

Voltage regulator phase 126 includes buck regulator 116 which can receive an input voltage at regulator input 240 and drive an output voltage onto regulator output 242. Driver M1 is configured to enable and disable FETs within buck regulator 116, in response to a control signal, e.g., 124, FIG. 1, received at control input 250. According to embodiments, control signal 124 can be a digital signal having logical "0" and logical "1" levels of 0 V and 3.3 V, respectively. In some embodiments, other voltage levels may be used.

Voltage regulator phase 126 also includes an input protection device 114, an ORing device 118 and a phase-redundant controller 106. Phase-redundant controller 106 includes current detect circuit 234, output overvoltage protect circuit 232 and input overcurrent protect circuit 230. Input overcurrent protect circuit 230 is electrically connected and configured to monitor current received at the YIN input 136, while output overvoltage protect circuit 232 can monitor output voltage at regulator output 242. Latch 228 is part of input overcurrent protect circuit 230, which is electrically connected to output overvoltage protect circuit 232. Current detect circuit 234 can be used to monitor output current at regulator output 242.

Phase-redundant controller 106 can be useful in monitoring input and output current and output voltage of the voltage regulator phase 126 and can, in response, control input protection device 114, which can be used for providing input overcurrent protection and output overvoltage protection for voltage regulator phase 126.

Phase-redundant controller 106 can control input protection device 114 through asserting the Q output of latch 228 of input overcurrent protect circuit 230. The Q output of latch 228 is used to control a gate input G input of input protection FET 238. Input protection FET 238 has a drain input D coupled to the YIN input 136 a source input S coupled to the regulator input 240. A control signal applied to a gate input G of input protection FET 238 can activate or deactivate input protection FET 238, which either electrically connects or disconnects, respectively, YIN input 136 and regulator input 240 of buck regulator 116. The control of input protection device 114 by phase-redundant controller 106 can be useful in providing input overcurrent protection and output overvoltage protection to the voltage regulator phase 126 by electrically isolating the regulator input 240, when buck regulator 116 faults or fails, from the other phases within a voltage regulator apparatus.

In some applications, current detect circuit 234 can provide, on detected current output 202, a signal having an analog voltage level between 0 V and 3.3 V that proportionally represents a level of detected current flowing out of $V_{OUT}$ output 148 the voltage regulator phase 126. In some applications, other analog voltage levels/ranges may be used. In embodiments, the detected current signal can be useful in indicating the failure of a particular regulator phase.

ORing device 118 can be used to limit or prevent reverse current flow into the $V_{OUT}$ output 148 of the voltage regulator phase 126, and thus also regulate reverse current flow into regulator output 242. Such reverse current flow can result from the short-circuiting or failure of a FET or a capacitor within buck regulator 116. Comparator 246 has inputs electrically connected to a source terminal S and to a drain terminal D of the output ORing FET 244. The output of comparator 246 is electrically connected to gate terminal G of the output ORing FET 244. Comparator 246 configured and connected to, in conjunction with the output ORing FET 244, limit current flow into regulator output 242, in response to a voltage at $V_{OUT}$ output 148 that is greater than a voltage at regulator output 242. In the case where a voltage at $V_{OUT}$ output 148 is greater than a voltage at regulator output 242, indicating a reverse current flow, the comparator 246 outputs to the gate G of output ORing FET 244 a low voltage, thus disabling output ORing FET 244 and preventing further reverse current flow.

The phase-redundant controller 106, input protection device 114 and buck regulator 116 of spare voltage regulator phase 227 are generally consistent with voltage regulator phase 126 in regards to electrical interconnection and function. Spare voltage regulator phase 227 also includes output switching devices 217 and 219, which for ease of illustration and discussion, are depicted as and referred to as "FET 217" and "FET 219" herein, without loss of meaning. In embodiments, switch devices 217 and 219 can each also be an NFET, a PFET, an NPN transistor, a PNP transistor, or other suitable type of transistor or semiconductor device.

FET 217 and FET 219 each have a gate input G electrically connected to enable input 216 and enable input 218, respectively. These interconnections allow FET 217 and FET 219 to be activated, i.e., enable an electrically conductive path between the drain D and source S terminals, in response to phase enable signals received on respective enable inputs 216 and 218 of phase-redundant controller 106. This activation can be used to electrically connect regulator output 242 of buck regulator 116, through ORing device 118 and secondary ORing device 118A, respectively, to either primary output 204 or secondary output 206. In embodiments, primary output 204 and secondary output 206 can be electrically connected to common regulator outputs of a phase group (See FIG. 3).

The electrical configuration and function of ORing device 118 and secondary ORing device 118A of spare voltage regulator phase 227 are consistent with the configuration and function of ORing device 118 of voltage regulator phase 126. Similar to ORing device 118 of voltage regulator phase 126, ORing device 118 and secondary ORing device 118A of spare voltage regulator phase 227 can be used to limit or prevent reverse current flow into the primary output 204 and secondary output 206, respectively, of the spare voltage regulator phase 227, and thus also regulate reverse current flow into regulator output 242.

Figure 3:
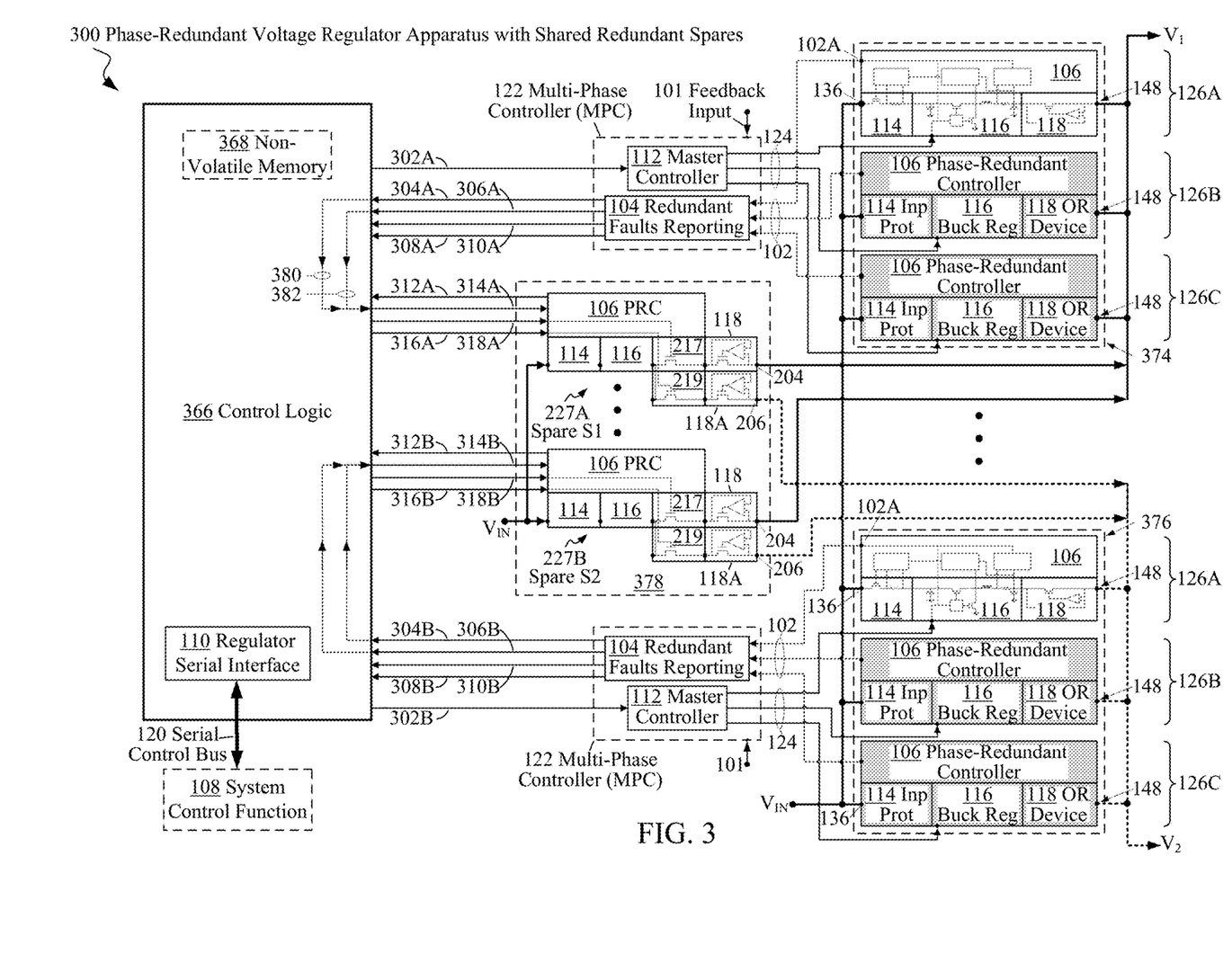
FIG. 3 is a block diagram depicting a phase-redundant voltage regulator apparatus with shared redundant spares, according to embodiments consistent with the figures.

FIG. 3 is a block diagram depicting a phase-redundant voltage regulator apparatus with shared redundant spares 300, according to embodiments generally consistent with the figures. FIG. 3 is particularly useful in depicting a phase-redundant voltage regulator apparatus, consistent with FIG. 1 and FIG. 2 that includes spare voltage regulator phases 227A and 227B that are electrically assignable to phase groups 374 and 376.

Numerous aspects of the embodiments depicted in FIG. 3 are particularly consistent with those depicted in FIGS. 1 and 2, and described in the associated text, and will not be further described herein. These aspects include circuits, logical and control functions, interactions between functions, electrical interconnections, signal usage and signal voltage ranges.

The elements of phase-redundant voltage regulator apparatus 300 including control logic 366, MPCs 122, voltage regulator phases, e.g., 126A, and spare voltage regulator phases, e.g., 227A, are electrically interconnected and thereby communicate through the use of various types of signals. These types include phase fault signals, phase enable signals, and $I_{SHARE}$ phase control signals. These signal types can be useful in enabling both monitoring of regulator phase function and faults, as well as control and reallocation of regulator phases by control logic 366.

Phase fault signals are used in embodiments to indicate a fault or failure of a particular regulator phase within the voltage regulator apparatus 300. Phase fault signals can be generated by a redundant faults reporting circuit 104, in response to detected current outputs 102 received from individual phase-redundant controllers (PRCs) 106 of voltage regulator phases, e.g., 126A. For example, a detected current output 102 received by redundant faults reporting circuit 104 that is significantly higher or lower than other detected current outputs 102 can resulting in redundant faults reporting circuit 104 generating a respective phase fault signal for the corresponding phase. Phase fault signals can be also be generated directly by PRCs 106 of spare regulator phases, e.g., 227A and 227B.

Phase fault signals include $V_1$ fault in signal 302A, $V_2$ fault in signal 302B, $V_1$ N-1 fault signal 308A, $V_1$ N-2 fault signal 310A, $V_2$ N-1 fault signal 308B, $V_2$ N-2 fault signal 310B, S1 fault signal 312A and S2 fault signal 312B.

The naming convention of phase fault signals, as listed above, includes an associated common regulator output voltage, e.g., "$V_1$" or "$V_2$," a spare regulator indicator, e.g., "S" or "S2," corresponding to spare regulator phases 227A and 227B, respectively, and a fault "level" indicator, e.g., "N-1" or "N-2." A fault level indicator of "N-1" indicates that the fault signal indicates a "single-fault" type, that is, the particular phase group from which the fault signal originates has only one reported fault among the voltage regulators in the phase group. Similarly, a fault level indicator of "N-2" indicates that the fault signal indicates a "double-fault" type, i.e., the particular phase group from which the fault signal originates has two reported faults among the voltage regulators in the phase group. A "spare fault" signal, e.g., S1 fault signal 312A, can be used to indicate the failure of a spare regulator phase, e.g., 227A. The various phase fault signals can be useful in providing indications of faults that can be used by control logic 366 in determining how to re-allocate spare phases to provide continued, robust voltage regulator performance in the event of one or more phase failures.

Phase enable signals are used in embodiments to enable the outputs of spare regulator phases, e.g., 227A, in order to selectively interconnect them to common regulator outputs, e.g., $V_1$. In embodiments, phase enable signals are generated by control logic 366. Phase enable signals include S1 enable $V_1$ signal 316A, S1 enable $V_2$ signal 318A, S2 enable $V_1$ signal 316B and S2 enable $V_2$ signal 318B. The naming convention of phase fault signals, as listed above, includes an associated common regulator output voltage, e.g., "$V_1$" or "$V_2$," and an associated spare regulator indicator, e.g., "S1" or "S2."

In embodiments, $I_{SHARE}$ phase control signals are signals that represent, through an analog voltage, an amount of current to be provided by each regulator phase within a phase group. In embodiments, a current "$I_{SHARE}$"=$I_{TOTAL}$/N, where=$I_{TOTAL}$ is the total current output of a phase group and "N" is the number of phases in the phase group. In some embodiments, $I_{SHARE}$ signals can be analog voltages in a range between 0 V and 3.3 V, respectively. By way of example, an $I_{SHARE}$ signal voltage of 0 V can represent 0 A of regulator phase current output, while an $I_{SHARE}$ signal voltage of 3.3 V can represent the full rated, e.g., maximum, regulator phase output current. $I_{SHARE}$ voltages between 0 V and 3.3 V can accordingly represent regulator phase output currents linearly proportional, between 0A and the full rated regulator phase output current, to the respective $I_{SHARE}$ voltage. In some embodiments, other scaling/control schemes and/or voltage ranges may be used.

An $I_{SHARE}$ phase control signal can be generated, for example, by an MPC 122 of a phase group, e.g., 374, as an indicator of the current output required from each voltage regulator within the phase group. The $I_{SHARE}$ phase control signal may vary over time, in order to modulate the voltage regulator's output to supply particular dynamic current loads.

An $I_{SHARE}$ phase control signal can also be received and used to modulate a spare voltage regulator phase in order to cause it to perform similarly to active voltage regulator phases within a phase group. Thus, an $I_{SHARE}$ phase control signal, in conjunction with phase enable signals, can be particularly useful in replacing a failed voltage regulator phase with an active spare voltage regulator phase. $I_{SHARE}$ phase control signals include $V_1$ $I_{SHARE}$ S1 signal 304A, $V_1$ $I_{SHARE}$ S2 signal 306A, $V_2$ $I_{SHARE}$ S1 signal 304B, $V_2$ $I_{SHARE}$ S2 signal 306B, S1 $I_{SHARE}$ signal 314A and S2 $I_{SHARE}$ signal 314B.

According to embodiments, phase fault signals and phase enable signals can be digital signals having logical "0" and logical "1" levels of 0 V and 3.3 V, respectively. In some embodiments, other voltage levels can be used. FIG. 3 depicts the above-described signals as lines with arrowheads; it can be understood that the end of the signal line having the arrowhead indicates the destination of the particular signal, while the opposite end indicates the source of the signal.

Phase-redundant voltage regulator apparatus 300 includes phase groups 374 and 376, each including multiple voltage regulator phases 126A, 126B and 126C and also including an interconnected MPC 122. Voltage regulator apparatus 300 also includes spare regulator phases 227A and 227B, each including output switching devices 217 and 219, and ORing devices 118 and 118A. Control logic 366, including non-volatile memory 368 and regulator serial interface 110, is electrically connected to each of the voltage regulator phases, spare voltage regulator phases, and MPCs.

Consistent with FIG. 1, each phase group 374 and 376 includes multiple redundant voltage regulator phases 126A, 126B and 126C, which can be useful for providing phase-redundancy in the delivery of power to common regulator outputs $V_1$ and $V_2$, respectively. The $V_{OUT}$ output 148 of each phase within a phase group is connected to a common regulator output, e.g., $V_1$. For ease of illustration and discussion, phase-redundant voltage regulator apparatus 300 includes two output voltage levels, i.e., common regulator outputs $V_1$ and $V_2$, and includes two spare regulator phases 227A and 227B. In embodiments, however, any number of voltage levels and number of spare regulator phases can be specified for a particular electronic system.

The MPC 122 of each phase group is electrically coupled to each regulator phase, e.g., 126A, 126B and 126C, of the phase group. The MPC 122 is configured to transfer, to control logic 366, phase fault signals and a shared current ($I_{SHARE}$) phase control signal received from each regulator phase of a respective phase group. The MPC 122 is also configured to generate $I_{SHARE}$ control signals that can be used to sequentially activate each regulator phase of the phase group for predetermined periods of time, which can be useful in managing controlled current-sharing between phases within a phase group.

Each spare regulator phase 227A and 227B includes output switching devices 217 and 219 and ORing devices 118 and 118A, which can be particularly useful for interconnecting the spare regulator phases 227A and 227B to common regulator outputs $V_1$ and/or $V_2$. According to embodiments, output switching devices 217 and 219 can be activated, and thus can connect regulator output 242 of buck regulator 116 to primary output 204 or secondary output 206 of a spare regulator phase, e.g., 227A. This activation can occur in response to receiving a phase S1 enable $V_1$ signal 316A or S1 enable $V_2$ signal 318A, respectively, for spare regulator phase 227A, for example. These phase enable signals are received by phase-redundant controller 106, and supplied to output switching devices 217 and 219, respectively. (See FIG. 2 for further details).

Control logic 366 is electrically connected to the MPCs 122 of each of the phase groups 374 and 376. The control logic 366 is configured to receive $I_{SHARE}$ phase control signals from, and exchange phase fault signals with the MPCs. Control logic 366 is also electrically connected to the spare regulator phases, and is configured to assert phase enable signals to, transfer $I_{SHARE}$ phase control signals to, and receive phase fault signals from the spare regulator phases. For example, S1 enable $V_2$ signal 318A can be asserted by control logic 366 to enable the secondary output 206 ($V_2$ output) of spare regulator phase 227A. Control logic 366 can also transfer $I_{SHARE}$ phase control signals, e.g., $V_1$ $I_{SHARE}$ S1 signal 304A or $V_1$ $I_{SHARE}$ S2 signal 306A, through connection 380 or connection 382, respectively, to S1 $I_{SHARE}$ signal 314A. Control logic 366 can also receive phase fault signals, e.g., $V_1$ N-2 fault signal 310A, from a spare regulator phase.

Control logic 366 can be particularly useful in monitoring voltage regulator phases for faults, and in response to detecting a faulty regulator phase, enabling and disabling various phases and supplying activated phases with $I_{SHARE}$ control signals. According to embodiments, $I_{SHARE}$ control signals received from a phase group can be transferred by the control logic 366 to a spare regulator phase, which can be useful in causing the spare regulator phase to be driven at a level consistent with active regulator phases of the phase group. Additional examples of functions performed by control logic 366 are further detailed in FIG. 4 and the associated text.

In embodiments, control logic 366 can include a non-volatile memory 368, which can be used for storing associations between activated spare regulator phases and phase groups having one or more faulty regulator phases. According to embodiments, the control logic 366 can be a microcontroller, custom integrated circuit (IC), programmable logic device (PLD), application-specific integrated circuit (ASIC), or the like. Non-volatile memory 368 can be a Flash memory, electrically erasable programmable read-only memory (EEPROM), or other type of memory device that does not lose data when a supply voltage is removed.

Embodiments of the present disclosure can be useful in reducing voltage regulator packaging size and cost, relative to a voltage regulator apparatus that uses dedicated voltage regulator phases to provide reliable, robust power delivery. These efficiencies are gained through the use of shared spare voltage regulator phases in place of redundant voltage regulator phases that are dedicated to a voltage level.

In some embodiments, a common regulator input VIN, as depicted in FIG. 3, can be connected to VIN inputs 136 of all of the phase groups 374 and 376, as well as the to VIN inputs 136 of all of the spare regulator phases 227A and 227B. In some embodiments, different common regulator inputs can be connected to the VIN inputs 136 and used to supply a unique voltage to each phase group and spare regulator phase. According to embodiments the $V_{OUT}$ output 148 of each of the regulator phases 326A, 326B and 326C within a phase group, e.g., 374, are all connected to the same common regulator output, e.g., $V_1$. In embodiments, the primary output 204 and secondary output 206 of each of the spare regulator phases 227A and 227B can both be selectively connected to either common regulator output $V_1$ or common regulator output $V_2$, in response to enable signals, e.g., S1 enable $V_1$ signal 316A or S1 enable $V_2$ signal 318A, asserted by control logic 366 on spare regulator phases 227A and 227B.

According to embodiments, a quantity of "N+1" or "N+2" voltage regulator phases can be electrically connected in parallel, where "N" is a minimum number of phases needed to supply a specified current, and the additional one or two phases can be useful in replacing one or two failed regulator phases. In the case of failure or "faulting" of one or more redundant phases, faulty redundant phase(s) can be disabled in order to share a current load and to ensure uninterrupted power delivery.

FIG. 3 depicts a phase-redundant voltage regulator having no current sharing circuitry between the voltage regulator phases 326A, 326B and 326C. Embodiments are contemplated, however, where current sharing is maintained between the voltage regulator phases 326A, 326B and 326C. In some such embodiments, independent current throttle points could be implemented within each regulator phase 326A, 326B and 326C, to enable a voltage regulator phase to run at its current output limit while one or more other voltage regulator phases provide the additional current required to satisfy a total current load. This embodiment can enable simplified current-sharing, which can allow certain voltage regulator phases to run at full current load, while additional voltage regulator phases can run at lower current levels. In some embodiments, passive or "droop" sharing can be implemented, where current sharing can result from an phase-redundant regulator output voltage drooping below a specified reference voltage, and, in response, the various regulator phases electrically connected to that output boost their respective current outputs. This can result in the sharing of the load between the regulators. In some embodiments, active or "forced" current sharing can be implemented through the use of added current monitoring, control, and feedback loops.

Figure 4:
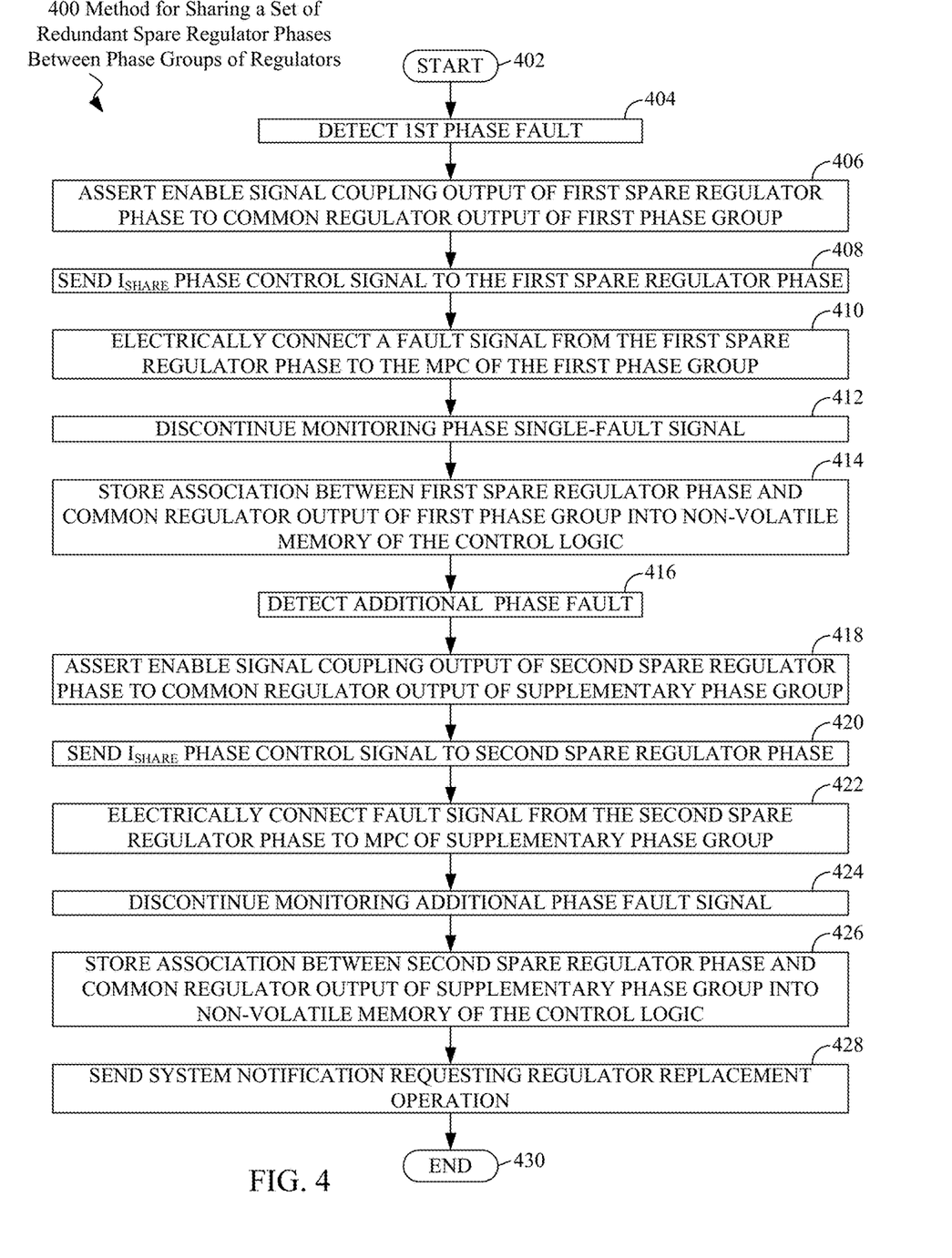
FIG. 4 is a flow diagram depicting a method for sharing a set of redundant spare regulator phases between groups of regulators, according to embodiments consistent with the figures.

FIG. 4 is a flow diagram depicting a method 400 for sharing, within a phase-redundant voltage regulator apparatus, a set of redundant spare regulator phases between groups of regulator phases, according to embodiments consistent with the figures. The phase-redundant voltage regulator apparatus includes a plurality of spare regulator phases, e.g., 227A, FIG. 3, and is consistent with the phase-redundant voltage regulators and apparatus depicted in and described in reference to FIGS. 1-3. The method 400 is generally executed through the use of control logic 366, FIG. 3, which is electrically connected and configured to monitor phase fault signals received from the phase groups, e.g., phase groups 374 and 376, FIG. 3.

The execution of method 400 can provide, through the use of shared redundant regulator phases controlled and allocated by control logic, enhanced reliability of power delivery to electronic systems. When used in conjunction with a phase-redundant voltage regulator apparatus of an electronic system, method 400 can also provide for substantial decreases in voltage regulator cost, packing area, design complexity, and failure rate, through the use of shared redundant regulator phases. Such improvements can result in corresponding overall decreases in electronic system cost, complexity, and failure rate. The method depicted and described with reference to FIG. 4 is generally consistent with the phase-redundant voltage regulator and apparatus with shared redundant spares depicted in and described in reference to FIGS. 1-3.

The operational state of the system at start 402 includes no voltage regulator phase faults, and both phase groups 374 and 376 are running normally with "N" phases being used to supply current to loads attached to common regulator outputs $V_1$ and $V_2$, respectively. The method 400 moves from start 402 to operation 404.

Operation 404 generally refers to detecting a first phase fault. Control logic 366, FIG. 3, is used to monitor the "N–1" phase single-fault signals, e.g., $V_1$ N–1 fault signal 308A and $V_2$ N–1 fault signal 308B, as generated by redundant faults reporting circuit 104 of the respective MPC 122. Control logic 366 determines which phase group the phase single-fault signal originates from. By way of example, a first phase fault can be detected in phase group 374. Once the first phase fault is detected, the method 400 moves to operation 406

Operation 406 generally refers to asserting a phase enable signal that electrically couples an output of the first available spare regulator phase to a common regulator output of the phase group having the first phase fault. In this example, spare voltage regulator phase 227A, FIG. 3, is the first available spare regulator phase. Accordingly, control logic 366, FIG. 3 asserts the S1 enable $V_1$ signal 316A to spare regulator phase 227A, which enables its primary output 204 to be electrically connected to common regulator output $V_1$, of phase group 374. According to embodiments the first spare regulator phase can be configured, using phase enable signals, to output either the voltage present on common regulator output $V_1$ or the voltage present on common regulator output $V_2$. Once the phase enable signal is asserted, the method 400 moves to operation 408.

Operation 408 generally refers to transferring an $I_{SHARE}$ phase control signal to a first spare regulator phase. In embodiments, the $I_{SHARE}$ phase control signal that is transferred is received from the phase group generating the phase single-fault signal, in this example, phase group 374. The $I_{SHARE}$ phase control signal is generated by the MPC 122 of phase group 374. The $I_{SHARE}$ phase control signal received by control logic 366 in this example is $V_1$ $I_{SHARE}$ S1 signal 304A, which is then transferred as S1 $I_{SHARE}$ signal 314A to spare regulator phase 227A. This $I_{SHARE}$ phase control signal is then used to modulate the output of the spare regulator phase 227A consistently with the outputs of the active voltage regulator phases of phase group 374. Once the $I_{SHARE}$ phase control signal is sent to a first spare regulator phase, the method 400 moves to operation 410.

Operation 410 generally refers to electrically connecting a phase fault signal from the first spare regulator phase to the MPC of the first phase group. In this example, S1 fault signal 312A is electrically connected, by control logic 366, to $V_1$ fault in signal 302A of MPC 122 of phase group 374. This MPC 122 can monitor the assigned spare voltage regulator phase 227A for faults, and communicate a fault to control logic 366. Once the phase fault signal is connected, the method 400 moves to operation 412.

Operation 412 generally refers to discontinuing the monitoring of the phase single-fault signal. Once a phase single-fault signal has been detected from phase group 374, FIG. 3, the control logic 366, FIG. 3, discontinues monitoring for a phase single-fault signal. Once the monitoring of the phase single-fault signal has been discontinued, the method 400 moves to operation 414.

Operation 414 generally refers to storing an association between the first used spare regulator phase and the common regulator output of the first phase group, into a non-volatile memory, e.g., 368, FIG. 3, within the control logic. In this example, the association includes information re: the phase group, i.e., "phase group 374" or the common regulator output $V_1$, and the spare, i.e., spare regulator phase 227A. This information is stored in non-volatile memory 368, which can be useful in preserving the linkage of the spare regulator phase 227A to the common regulator output $V_1$, in the event of a power failure. Upon restart of the voltage regulator following a power failure, control logic 366 can re-initialize the electrical connection of spare regulator phase 227A to the common regulator output $V_1$. Once the association has been stored, the method 400 moves to operation 416.

Operation 416 generally refers to detecting a additional phase fault. In embodiments, a additional phase fault can be indicated by a phase single-fault signal, a phase double-fault signal or a spare phase fault signal. Control logic 366, FIG. 3, is used to monitor each of these types of phase fault signals, as generated by redundant faults reporting circuit 104 of the respective MPCs 122 and by phase-redundant controllers 106 of spare regulator phases, e.g., 227A. Control logic 366 determines which supplementary voltage regulator phase group or spare voltage regulator that the additional phase fault signal originates from. According to embodiments, the supplementary phase group can be either the first phase group or the second phase group. By way of example, an additional phase single-fault can be detected in phase group 376. Once the additional phase fault is detected, the method 400 moves to operation 418.

Operation 418 generally refers to asserting a phase enable signal that electrically couples an output of the second available spare regulator phase to a common regulator output of the phase group having the additional phase fault. In this example, spare voltage regulator phase 227B, FIG. 3, is the second available spare regulator phase. Accordingly, control logic 366, FIG. 3 asserts the S2 enable $V_2$ signal 318B to spare regulator phase 227B, which enables secondary output 206 to be electrically connected to common regulator output $V_2$, of phase group 376. According to embodiments the second spare regulator phase can be configured, using phase enable signals, to output either the voltage present on common regulator output $V_1$ or the voltage present on common regulator output $V_2$. Once phase enable signal has been asserted, the method 400 moves to operation 420.

Operation 420 generally refers to transferring an $I_{SHARE}$ phase control signal to a second spare regulator phase. In embodiments, the $I_{SHARE}$ phase control signal that is transferred is received from the phase group generating the additional phase fault signal, in this example, phase group 376. The $I_{SHARE}$ phase control signal is generated by the MPC 122 of phase group 376. The $I_{SHARE}$ phase control signal received by control logic 366 in this example is $V_2$ $I_{SHARE}$ S2 signal 306B, which is then transferred as S2 $I_{SHARE}$ signal 314B to spare regulator phase 227B. This $I_{SHARE}$ phase control signal is then used to modulate the out of the spare regulator phase 227B consistently with the outputs of the active voltage regulator phases of phase group 376. Once the $I_{SHARE}$ phase control signal has been sent, the method 400 moves to operation 422.

Operation 422 generally refers to electrically connecting a phase fault signal from the second spare regulator phase to the MPC of the supplementary phase group. In this example, S2 fault signal 312B is electrically connected, by control logic 366, to $V_2$ fault in signal 302B of MPC 122 of phase group 376. This MPC 122 can monitor the assigned spare voltage regulator phase 227B for faults, and communicate a fault to control logic 366. Once the phase fault signal has been electrically connected, the method 400 moves to operation 424.

Operation 424 generally refers to discontinue the monitoring of the additional phase fault signal. Once a additional phase fault signal has been detected from phase group 376, the control logic 366 discontinues monitoring for a additional phase fault signal. Once the monitoring of the additional phase fault signal has been discontinued, the method 400 moves to operation 426.

Operation 426 generally refers to storing an association between the second used spare regulator phase and the common regulator output of the additional phase group into a non-volatile memory, e.g., 368, FIG. 3, within the control logic 366, FIG. 3. In this example, the association includes information re: the phase group, i.e., "phase group 376" or the common regulator output $V_2$, and the spare, i.e., spare regulator phase 227B. This information is stored in non-volatile memory 368, FIG. 3, which can be useful in preserving the linkage of the spare regulator phase 227B to the common regulator output $V_2$, in the event of a power failure. Upon restart of the system following a power failure, control logic 366 can re-initialize the electrical connection of spare regulator phase 227B to the common regulator output $V_2$. Once the association has been stored into the non-volatile memory, the method 400 moves to operation 428.

Operation 428 generally refers to sending a system notification requesting a regulator replacement operation. This notification is initiated in response to both of the spare regulator phases 227A and 227B being in use, i.e., electrically coupled to common regulator outputs of the phase groups, with no additional spare regulator phases available for use in the case of an additional failure of a voltage regulator phase. The system notification requesting a regulator replacement operation can be, for example, an email message, a text message, a system console message or a voicemail message. Once the system notification has been sent, the method 400 ends at block 430.

It can be understood that the above method is suitable for an "N+2" voltage regulator phase configuration, i.e., a configuration that includes 2 available spare voltage regulators that may be used in the case of failure of one or more voltage regulators of a particular phase group. Other similar methods, within the spirit and scope of the present disclosure, may be used for a voltage regulator apparatus having a different number of available spare voltage regulators, such as 1, 3, 4 and so on.

According to embodiments, a current delivery capacity of each regulator phase within a phase group can be specified so as to result in the delivery of a specified cumulative output current of the phase group following a failure of one regulator phase within a phase group. In some embodiments, the per-phase current delivery capacity of each regulator phase within a phase group can allow for delivery of a specified cumulative output current of the phase group following a failure of at least two regulator phases within a phase group.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A phase-redundant voltage regulator apparatus comprising:
   a plurality of regulator phases, each including a regulator electrically coupled to receive, at a regulator input, an input voltage and provide, at a regulator output, a respective output voltage;
   a set of phase groups of the plurality of regulator phases including a first and a second phase group, each phase group including:
      a common regulator input electrically interconnected to regulator inputs of regulators of each phase group,
      a common regulator output electrically interconnected to regulator outputs of regulators of each phase group,
      at least one redundant regulator phase, and
      a multi-phase controller (MPC) electrically coupled to each regulator phase of each phase group, the MPC configured to transfer, to control logic, phase fault signals and a shared current (Ishare) phase control signal received from each regulator phase of a respective phase group;

a set of spare regulator phases of the plurality of regulator phases including a first and a second spare regulator phase, each spare regulator phase including:
    a secondary output ORing device electrically coupled and configured to limit current flow into a secondary output of each spare regulator phase,
    a first output switching device configured to, in response to a first phase enable signal, electrically couple the regulator output of each spare regulator phase to a first common regulator output, and
    a second output switching device configured to, in response to a second phase enable signal, electrically couple the regulator output of each spare regulator phase to a second common regulator output; and
control logic, electrically connected to:
    MPCs of each phase group of the set of phase groups, the control logic configured to receive Ishare phase control signals from, and exchange phase fault signals with the MPCs, and
    spare regulator phases of the set of spare regulator phases, the control logic configured to assert phase enable signals to, transfer Ishare phase control signals to, and receive phase fault signals from the spare regulator phases;
    the control logic configured to, in response to a failed regulator phase, receive a phase fault signal from an MPC and electrically interconnect one of the spare regulator phases of the set of spare regulator phases to a phase group that includes the failed regulator phase.

2. The phase-redundant voltage regulator apparatus of claim 1, each regulator phase of the plurality of regulator phases further including:
    a phase-redundant controller (PRC) configured to monitor current at the regulator input and further configured to monitor current and voltage at the regulator output;
    an output ORing device configured to limit current flow into a primary output of a respective regulator phase; and
    an input protection device configured to provide, in response to a control signal from the PRC, input overcurrent protection and output overvoltage protection to the respective regulator phase.

3. The phase-redundant voltage regulator apparatus of claim 2, wherein the output ORing device and the secondary output ORing device are each selected from a group consisting of: an N-channel field-effect transistor (NFET), a P-channel field-effect transistor (PFET), an NPN transistor, and a PNP transistor.

4. The phase-redundant voltage regulator apparatus of claim 1, wherein the MPC of each phase group is further configured to:
    receive a feedback output voltage and receive a respective detected current signal from each regulator phase of the phase group;
    generate $I_{SHARE}$ control signals to sequentially activate each regulator phase of the phase group for predetermined periods of time, the $I_{SHARE}$ control signals managing controlled current-sharing between phases; and
    maintain, following a failure of one or more regulator phase of the phase group, current-sharing between all active regulator phases of the phase group.

5. The phase-redundant voltage regulator apparatus of claim 1, wherein each $I_{SHARE}$ control signal is an analog signal that represents, through a voltage, a required current output level of at least one regulator phase.

6. The phase-redundant voltage regulator apparatus of claim 1, wherein a regulator serial interface of an MPC is coupled to a system control function through a serial control bus selected from a group consisting of: a Serial Peripheral Interface (SPI) interface, a Power Management Bus (PM-Bus) interface, and an Inter-Integrated Circuit (I2C) interface.

7. The phase-redundant voltage regulator apparatus of claim 1, wherein the first phase group of the set of phase groups is configured to maintain current sharing.

8. A phase-redundant voltage regulator apparatus comprising:
    a plurality of regulator phases, each including a regulator electrically coupled to receive, at a regulator input, an input voltage and provide, at a regulator output, a respective output voltage;
    a set of phase groups of the plurality of regulator phases including a first and a second phase group, each phase group including;
        a common regulator input electrically interconnected to regulator inputs of regulators of each phase group;
        a common regulator output electrically interconnected to regulator outputs of regulators of each phase group;
        at least one redundant regulator phase, and
        a multi-phase controller (MPC) electrically coupled to each regulator phase of each phase group, the MPC configured to transfer, to control logic, phase fault signals and a shared current (Ishare) phase control signal received from each regulator phase of a respective phase group;
    a set of spare regulator phases of the plurality of regulator phases including a first and a second spare regulator phase, each spare regulator phase including:
        a secondary output ORing field-effect transistor (FET) electrically coupled between each regulator output and a secondary output of each spare regulator, phase,
        a second comparator having inputs electrically connected to a source terminal and to a drain terminal of the secondary output ° Ring FET, the second comparator further having an output electrically connected to a gate terminal of the secondary output ORing FET, the second comparator configured to, in conjunction with the secondary output ORing FET, limit current flow into the secondary output of each spare regulator phase,
        a first output switching FET electrically connected and configured to, in response to a first phase enable signal, electrically couple each regulator output of each spare regulator phase to a first common regulator output,
        a second output switching FET connected and configured to, in response to a second phase enable signal, electrically couple each regulator output of each spare regulator phase to a second common regulator output; and
    control logic, electrically connected to:
        MPCs of each phase group of the set of phase groups, the control logic configured to receive Ishare phase control signals from, and exchange phase fault signals with the MPCs, and
        spare regulator phases of the set of spare regulator phases, the control logic configured to assert phase enable signals to, transfer Ishare phase control signals to, and receive phase fault signals from the spare regulator phases;

the control logic configured to, in response to a failed regulator phase, receive a phase fault signal from an MPC and electrically interconnect one of the spare regulator phases of the set of spare regulator phases to a phase group that includes the failed regulator phase.

9. The phase-redundant voltage regulator apparatus of claim 8, each regulator phase of the plurality of regulator phases further including:

a phase-redundant controller (PRC) configured to monitor current at the regulator input and further configured to monitor current and voltage at the regulator output;

an output ORing FET electrically coupled between a primary output of the regulator and the common regulator output;

a first comparator having inputs electrically connected to a source terminal and to a drain terminal of the output ORing FET, the first comparator further having an output electrically connected to a gate terminal of the output ORing FET, the comparator configured to, in conjunction with the output ORing FET, limit current flow into the primary output of a respective regulator phase;

an input protection FET coupled between the common regulator input and a regulator input of the regulator; and a latch having an output electrically connected to a gate terminal of the input protection FET, the latch configured to, in conjunction with the input protection FET, provide input overcurrent protection and output overvoltage protection to the respective regulator phase.

10. The phase-redundant voltage regulator apparatus of claim 9, wherein the MPC of each phase group is further configured to:

receive a feedback output voltage and receive a respective detected current signal from each regulator phase of the phase group;

generate $I_{SHARE}$ control signals to sequentially activate each regulator phase of the phase group for predetermined periods of time, the $I_{SHARE}$ control signals managing controlled current-sharing between phases; and maintain, following a failure of one or more regulator phase of the phase group, current-sharing between all active regulator phases of the phase group.

11. The phase-redundant voltage regulator apparatus of claim 8, wherein each $I_{SHARE}$ control signal is an analog signal that represents, through a voltage, a required current output level of at least one regulator phase.

12. The phase-redundant voltage regulator apparatus of claim 8, wherein a regulator serial interface of an MPC is coupled to a system control function through a serial control bus selected from a group consisting of: a Serial Peripheral Interface (SPI) interface, a Power Management Bus (PMBus) interface, and an Inter-Integrated Circuit (I2C) interface.

13. The phase-redundant voltage regulator apparatus of claim 8, wherein the first phase group of the set of phase groups is configured to maintain current sharing.

14. A method for sharing a set of redundant spare regulator phases between phase groups of regulator phases, the method comprising using control logic configured to, in response to monitoring phase fault signals received from the phase groups:

assert, to a first spare regulator phase of the set of redundant spare regulator phases, in response to detecting a phase single-fault signal from a first phase group, a phase enable signal that electrically couples an output of the first spare regulator phase to a common regulator output of the first phase group;

send, to the first spare regulator phase, shared current ($I_{SHARE}$) phase control signals received from a multiphase controller (MPC) of the first phase group;

electrically connect a phase fault signal from the first spare regulator phase to the MPC of the first phase group;

discontinue, in response to detecting the phase single-fault signal from the first phase group, monitoring the phase single-fault signal;

store, into a non-volatile memory within the control logic, an association between the first spare regulator phase and the common regulator output of the first phase group;

assert, to a second spare regulator phase of the set of redundant spare regulator phases, in response to detecting an additional phase fault signal from a supplementary phase group, a phase enable signal that electrically couples an output of the second spare regulator phase to a common regulator output of the supplementary phase group;

send, to the second spare regulator phase, an $I_{SHARE}$ phase control signal received from an MPC of the supplementary phase group;

electrically connect a phase fault signal from the second spare regulator phase to the MPC of the supplementary phase group;

discontinue, in response to detecting the additional phase fault signal from the supplementary phase group, monitoring the additional phase fault signal;

store, into the non-volatile memory, an association between the second spare regulator phase and the common regulator output of the supplementary phase group; and send, in response to outputs of all of the redundant spare regulator phases being electrically coupled to common regulator outputs of the phase groups, a system notification requesting a regulator replacement operation.

15. The method of claim 14, wherein the supplementary phase group is selected from a group consisting of: a first phase group, and a second phase group.

16. The method of claim 14, wherein a current delivery capacity of each regulator phase within a phase group is specified to result in delivery of a specified cumulative output current of the phase group following a failure of one regulator phase within a phase group.

17. The method of claim 14, wherein a current delivery capacity of each regulator phase within a phase group is specified to result in delivery of a specified cumulative output current of the phase group following a failure of at least two regulator phases within a phase group.

18. The method of claim 14, wherein the first spare regulator phase is configured to output a voltage selected from a group consisting of: a first voltage, and a second voltage.

19. The method of claim 14, wherein the additional phase fault signal is selected from a group consisting of: single-fault signal, a double-fault signal, and a spare fault signal.

20. The method of claim 14, wherein the system notification requesting a regulator replacement operation is selected from a group consisting of: an email message, a text message, a console message, and a voicemail message.

* * * * *